(12) United States Patent
Li et al.

(10) Patent No.: US 7,165,185 B2
(45) Date of Patent: *Jan. 16, 2007

(54) DDR II WRITE DATA CAPTURE CALIBRATION

(75) Inventors: Wen Li, Boise, ID (US); Christopher K. Morzano, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 296 days.

This patent is subject to a terminal disclaimer.

(21) Appl. No.: 10/751,437

(22) Filed: Jan. 6, 2004

(65) Prior Publication Data

US 2004/0143775 A1    Jul. 22, 2004

Related U.S. Application Data

(63) Continuation of application No. 09/650,079, filed on Aug. 29, 2000, now Pat. No. 6,691,214.

(51) Int. Cl.
*G06F 1/04* (2006.01)
*G06F 12/00* (2006.01)

(52) U.S. Cl. ............. 713/500; 711/167; 713/600

(58) Field of Classification Search ........... 713/400, 713/500, 600
See application file for complete search history.

(56) References Cited

U.S. PATENT DOCUMENTS

| 5,163,036 | A | * | 11/1992 | Yokogawa | ............... 369/53.34 |
| 5,920,511 | A | | 7/1999 | Lee et al. | |
| 6,011,751 | A | | 1/2000 | Hirabayashi | |
| 6,016,283 | A | | 1/2000 | Jeong | |
| 6,101,612 | A | * | 8/2000 | Jeddeloh | ............... 713/401 |
| 6,108,795 | A | * | 8/2000 | Jeddeloh | ............... 713/401 |
| 6,112,284 | A | * | 8/2000 | Hayek et al. | ............... 711/167 |
| 6,587,804 | B1 | * | 7/2003 | Johnson et al. | ............ 702/107 |
| 6,646,953 | B1 | * | 11/2003 | Stark | ............... 365/233 |
| 6,691,214 | B1 | * | 2/2004 | Li et al. | ............... 711/167 |
| 6,704,881 | B1 | * | 3/2004 | Li et al. | ............... 713/401 |
| 6,968,026 | B1 | * | 11/2005 | Li et al. | ............... 375/371 |

* cited by examiner

*Primary Examiner*—Chun Cao
(74) *Attorney, Agent, or Firm*—Dickstein Shapiro LLP

(57) ABSTRACT

A calibration circuit for calibrating the input data path of a digital circuit is disclosed. A simple string of a repeating data pattern such as, e.g., "1100," is sent on the data path. The digital circuit captures the data using a clock signal, examines the data signal for the predetermined pattern and adjusts a delay applied to the data signal until the predetermined pattern is recognized. Then the delay is further adjusted until the predetermined pattern is no longer recognized indicating that an edge of the eye of the data is near a clocking edge of the clocking signal. The delay applied to the data signal is then further adjusted by a predetermined amount to position the clock edge near the center of the data eye.

26 Claims, 11 Drawing Sheets

DDR II WRITE DATA CAPTURE CALIBRATION

This application is a continuation of Application No. 09/650,079, filed Aug. 29, 2000 now U.S. Pat. No. 6,691,214, the entire disclosure of which is incorporated herein by reference.

BACKGROUND OF THE INVENTION

1. Field of the Invention

The present invention is related to dynamic random access memory (DRAM) devices. In particular, it relates to a system and method for improving a DRAM's ability to capture data correctly on all data paths (DQs).

2. Description of Related Art

When double data rate (DDR) is applied to a memory device, the data is input/output to/from the memory device on both edges (i.e., rising and falling) of an external system clock CLK. That is, the memory device (e.g., a DRAM) receives/outputs two bits of data per whole CLK cycle, called 2-bit (or 2 n) prefetch. A DDR II memory device is similar to a DDR device but runs off an external clock CLK which is twice as fast (e.g., 200 MHz) as a DDR external clock. DDR II uses a 4-bit (or 4 n) prefetch such that 4-bits are transferred in/out of a data path then handled as one 4-bit-wide piece of data inside the memory.

Double data rate memory is one key element for boosting memory device throughput to keep pace with the ever-increasing throughput performance of microprocessors. By doubling the memory bandwidth over current generation synchronous DRAM devices, DDR II can provide a cost-effective, high-performance main memory solution that does not require a significant development or manufacturing investment, while maintaining a cost structure consistent with synchronous DRAMs. DDR II memory devices and modules are well-suited for a broad range of applications, especially the workstation and server markets, where the high module density and device architecture can meet the performance and reliability demands of these products.

DDR II memory technology has been defined and standardized by the Joint Electron Devices Engineering Council (JEDEC) as a next-generation memory solution. This technology is intended to facilitate adoption in a wide range of products, and to be offered in both device and module form from all major suppliers.

The DDR II standard proposes to have a minimum respective data setup and hold times of approximately 0.25 ns. Referring to FIG. 1, the data setup time is defined as the time the data is at the data input/output pin (DQ) before the next external system clock CLK edge arrives. The hold time is defined as the time the data stays valid after the clock edge. The entire window of data (setup and hold) is referred to as the "data eye." A data eye of approximately 1.5 ns is required in order for the DRAM to reliably capture the data (i.e., the DQ input pulse width (DIPW)). Moreover, in order for the DRAM to reliably capture the data, the clock CLK edge (either rising or falling) must be centered on the data eye. If the clock edge is not centered on the data eye, either one of the setup or hold times will be in danger of being of an insufficiently short duration, which may prevent the DRAM from properly capturing the data.

There are many reasons why the clock edge may not be centered on the data eye. Some of those reasons include clock jitter, noise on the board, different lengths of data traces on the board, etc., which cause a clock skew to occur. The problem is exacerbated with higher clock frequencies since the setup and hold time is reduced in those cases, thus, leaving less room for error when attempting to locate the clock edge on the center of the data eye.

One overly complex solution to maintaining the clock edge near the center of the data eye that has been proposed is known as "SyncLink." The SyncLink approach actually builds a mathematical model of the entire data eye and determines the exact location of the leading and trailing edges of the data. Once the system has calculated the location of the leading and trailing edges, the center of the data eye is calculated and the clock edge is located at the center of the data eye. While this method has proven to be accurate, it has also proven to be unnecessarily complex for most DDR II operating environments. This complexity results in greater chip complexity and cost. Thus, a simplified system and method are required to ensure that data which is input to a DRAM is properly timed relative to the external DRAM clock CLK such that the data is driven by a clock edge located on the center of the data eye and is, thereby, properly captured by the DRAM.

SUMMARY OF THE INVENTION

The present invention provides a simple system and method for controlling the rate with which data is input to a DRAM relative to the external DRAM clock CLK such that its clock edges are always centered on the data eye of input data to the DRAM, thus, ensuring that the data may always be properly captured by the DRAM.

In accordance with an exemplary embodiment of the invention, upon power-up or reset, during the existing initialization cycle time of the DRAM (i.e., 200 cycles under the DDR II standard), the write data capture calibration method of the invention is performed. A write command is issued by a memory controller and a simple repetitive string of data such as e.g., "110011001100 . . . " is sent by the memory controller to all the write data input paths (DQs) of the memory device, along with a bi-directional strobe (DQS) that is essentially a data clock aligned with data when it leaves the controller. The DRAM captures the data and performs a DQ to DQS delay adjustment to center the clock edge on the data eye for each DQ path. In the meantime, a delay lock loop (DLL) compares an internal data clock with the external clock to ensure they are both in phase. If they are out of phase, the DLL delays the internal clock until the two clocks are in phase. An auto-refresh automatically cancels the write data capture calibration method upon completion of the initial 200 cycles and the DRAM is returned to normal operation.

BRIEF DESCRIPTION OF THE DRAWINGS

These and other features and advantages of the invention will become more readily apparent from the following detailed description which is provided in connection with the accompanying drawings in which.

DETAILED DESCRIPTION OF PREFERRED EMBODIMENTS

Exemplary embodiments and applications of the invention will now be described with reference to FIGS. 2–12. It should be noted that the invention is described in the context of calibrating the data DQ paths of a memory device, such as a DRAM. However, the invention can also be used to calibrate data paths of any type of digital device and is not restricted to DRAM devices. Moreover, although an exemplary embodiment of the invention is described below, other embodiments may be realized and structural or logical changes may be made to the disclosed embodiment without departing from the spirit or scope of the invention.

Figure 1:
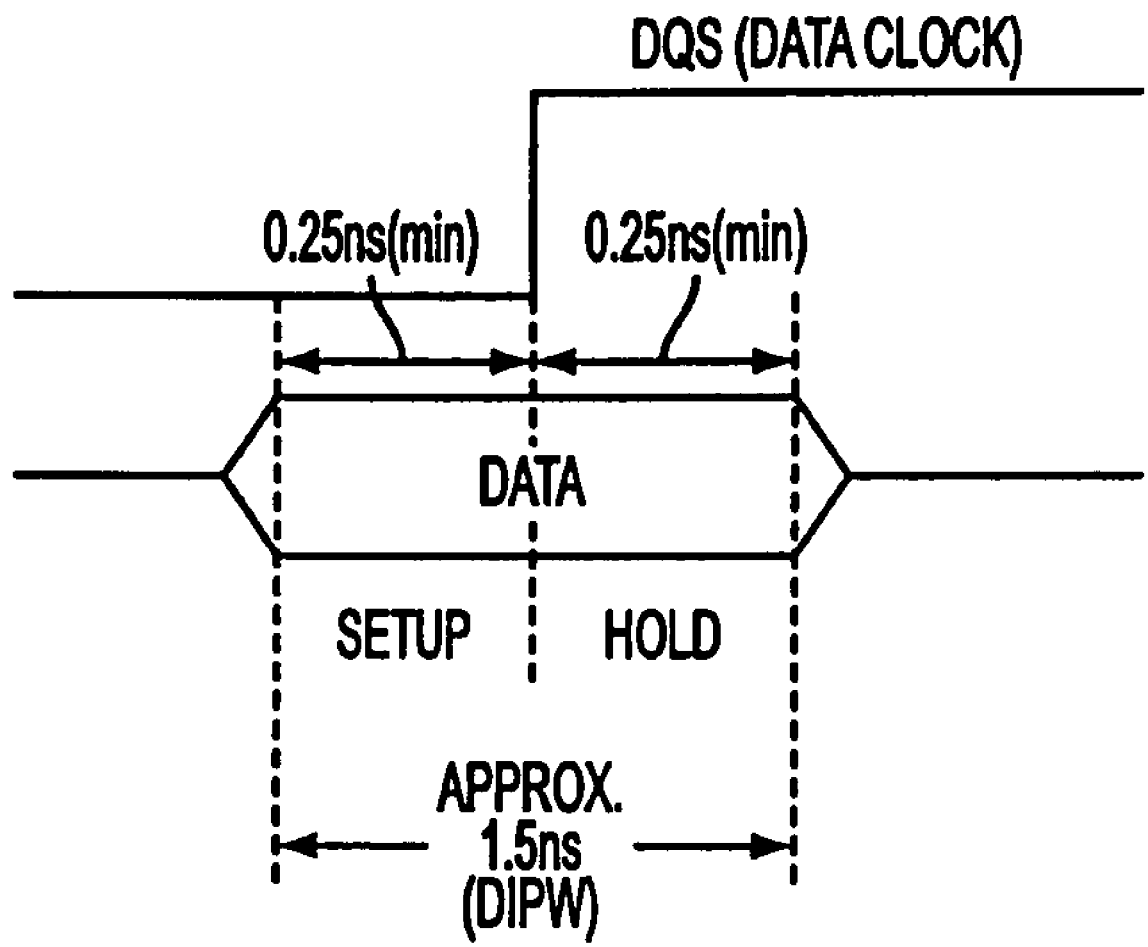
FIG. 1 illustrates DDR II set-up and hold time, as is known in the art.
Figure 2:
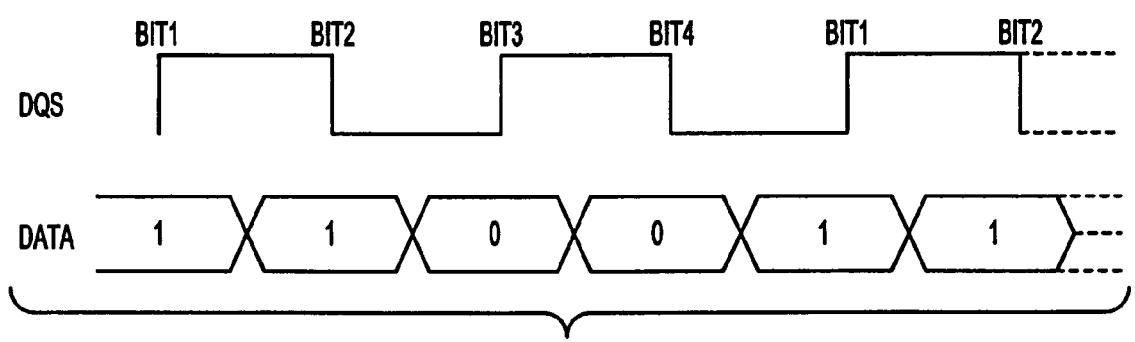
FIG. 2 depicts clock edges centered on a data eye in accordance with an embodiment of the invention.

FIG. 2 depicts clock edges centered on a data eye at the data path DQs 305 of a memory device (of FIG. 3) upon implementing the DDR II write data capture calibration method, in accordance with an embodiment of the invention. The rising edge of DQS is centered on the data eye of bit 1 ("1"); thus rendering the setup and hold times sufficient for the DRAM to capture the data. Similarly, the falling edge of DQS is centered on the data eye of bit 2 ("1"), and the rising edge of DQS is centered on the data eye of bit 3 ("0"), and so on.

Figure 3:
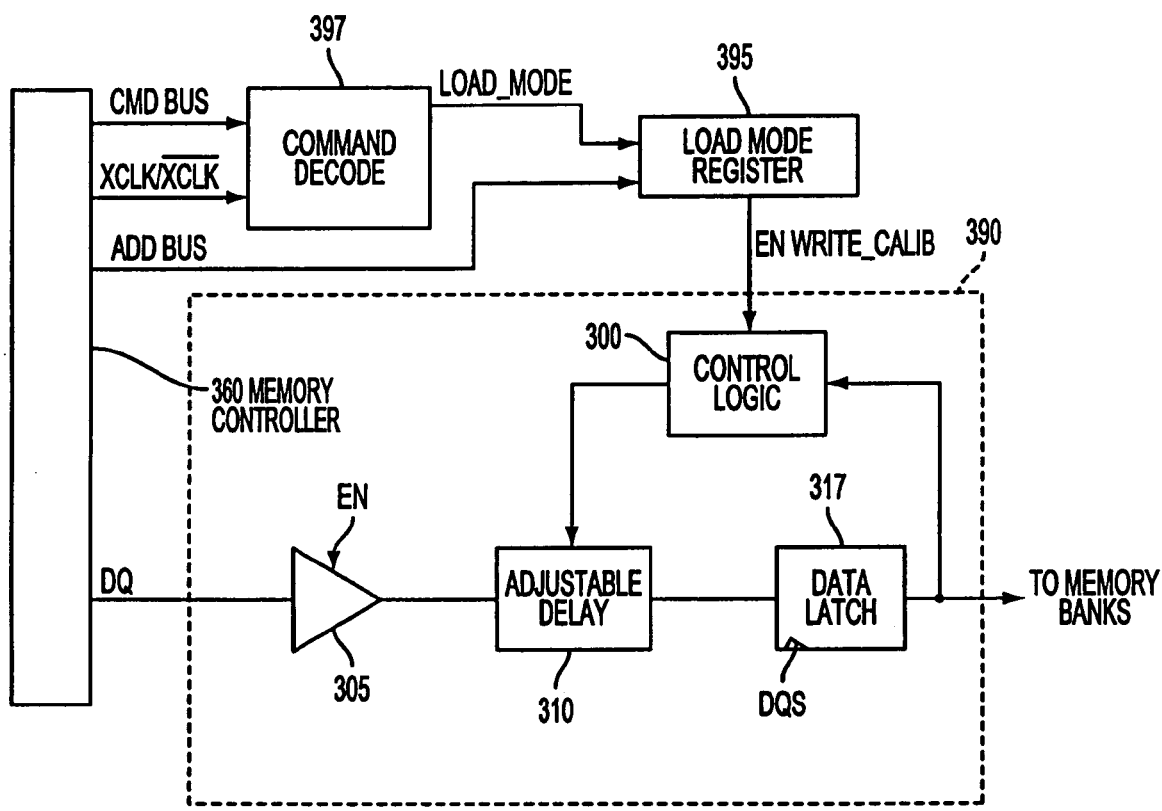
FIG. 3 depicts an exemplary block diagram of a control system, in accordance with an embodiment of the invention.

FIG. 3 depicts a simplified block diagram of a data path DQ including a control system 390 in accordance with an exemplary embodiment of the invention. During normal operation (i.e., when the control logic 300 is not enabled), the data which is to be input to a memory core is supplied by a memory controller 360 on the DQ data path. The data is passed through a receiver buffer 305 and then through an adjustable delay circuit 310. The data is then clocked into data latch 317, where it is eventually passed through to the memory core.

In accordance with standard practice, upon DRAM power-up or reset, a LOAD MODE command (LDMD) output from a command decoder 397 enables a delay lock loop (DLL) (not shown) to place the internal clock and the external clock CLK in phase. A 200 cycle initialization period is required for this operation. It is the LDMD received from a Load Mode Register 395 that also enables the control logic 300 and hence the calibration method of the invention. It should also be noted in connection with FIG. 3 that a command bus (CMDBUS) and a command clock (XCLK) and its inverse (XCLK) are driven by controller 360 into command decoder 397. An address bus (ADDBUS) is fed into Load Mode Register 395.

When the control logic 300 is enabled by the Load Mode Register 395 command (e.g., upon power-up or reset), the memory controller 360 drives a continuous known repeating data pattern, e.g., "1100," to each write data input path DQ. The data pattern is fed through to buffer 305, adjustable delay 310 and data latch 317 as described above; however, since the calibration system 390 is enabled, e.g., through the enabling of the control logic 300, the data is next fed into control logic 300.

Figure 4:
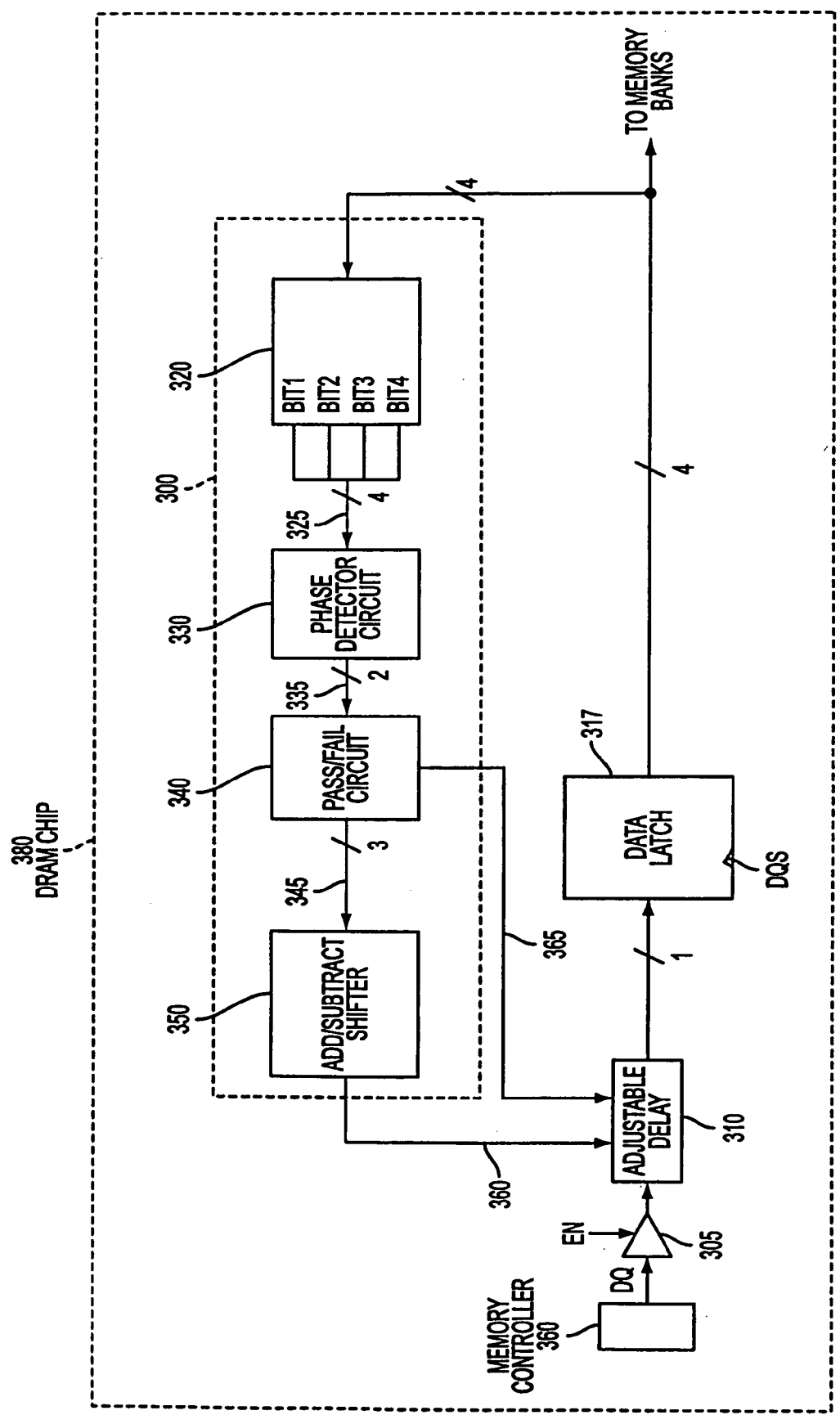
FIG. 4 depicts a more detailed block diagram of the FIG. 3 control system.

Turning to FIG. 4, a data latch 317 sequentially latches the data at four different clock edges. The data are then stored in four different registers (bits 1–4) of data register 320. At the output of the data register 320, the data is fed into phase detector 330 with a 4-bit bus 325. Phase detector 330 receives the initial data captured by the data register 320, here four bits, and passes it through a logic circuit which determines whether the data captured by the data register 320 is the known 4-bit pattern "1100" being sent by the controller 360 to each data path DQ. As will be explained below, it is possible that the captured four bits are the expected 1100 pattern or, if there is no proper alignment of the captured data with the data clock, the captured 4-bit data pattern could be "1001" or "0110" or an indeterminate pattern if data is not reliably captured at the edges of a data eye.

The phase detector circuit 330 determines whether the captured data is different from the expected pattern and, if so, that a delay needs to be added or subtracted to data coming into data latch 317 via data path DQ to obtain proper alignment of the data and clock, as will be described more fully below in connection with FIG. 5. It should be noted that phase detector 330 may be replaced with a comparator which would compare the received 4-bit pattern with the expected pattern. The comparator would provide one predetermined output level when the two inputs are not equal and another predetermined output level when the two inputs are equal.

Figure 5:
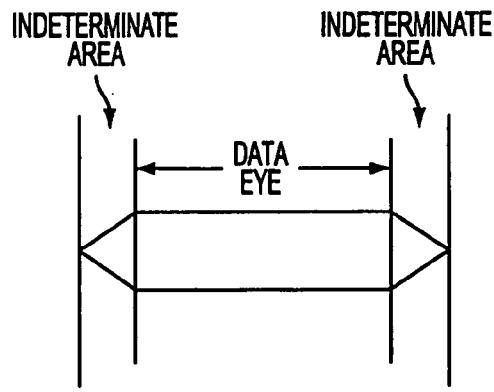
FIG. 5 depicts a digital signal having a data eye and two indeterminate portions.

Turning now to FIG. 5, a digital signal and its inverse are depicted as having a data eye and two indeterminate areas. That is, for each digital signal, the information is readable when a clock transition occurs within the area labeled data eye, and the information is in an indeterminate state when a clock transition is located within one of the indeterminate areas.

FIG. 6 depicts a clock pattern and three data patterns which may be read in accordance with an exemplary embodiment of the invention. FIG. 6(a) represents a clock pulse, the transition edges of which determine where on the digital data signal (of FIGS. 6(b)–(d)) the data is being read.

Figure 6A:
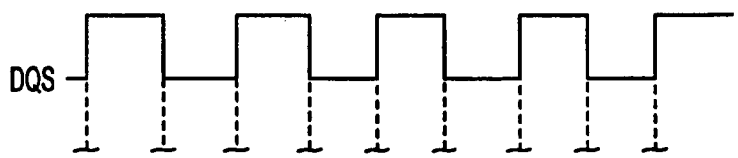
FIGS. 6(a)–6(d) depict DQS and data signals in accordance with an embodiment of the invention.
Figure 6B:
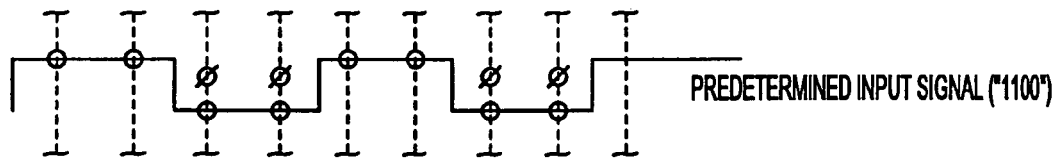

FIG. 6(b) represents a digital input signal consistent with the predetermined pattern ("1100"). The clock transition edges (represented by small circles on the data signal) fall at the center of the data eye for each bit of data in the digital signal.

Figure 6C:
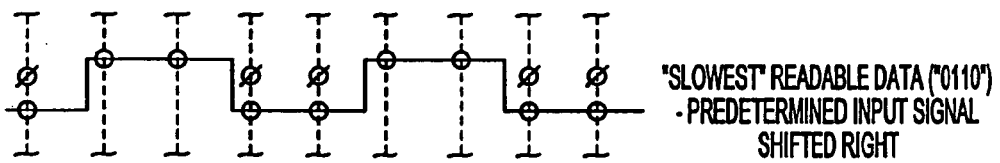

FIG. 6(c) represents a digital input signal inconsistent with the predetermined pattern ("0110"). Here, the clock transition edges fall on a left side of the data eye (i.e., the data is shifted right).

Figure 6D:
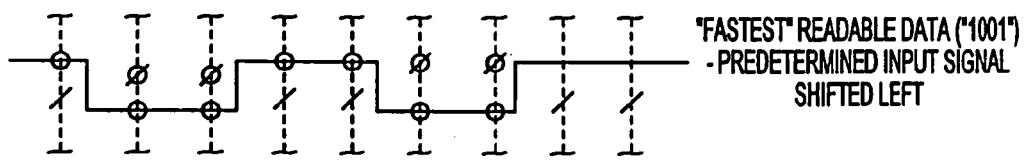
Figure 7A:
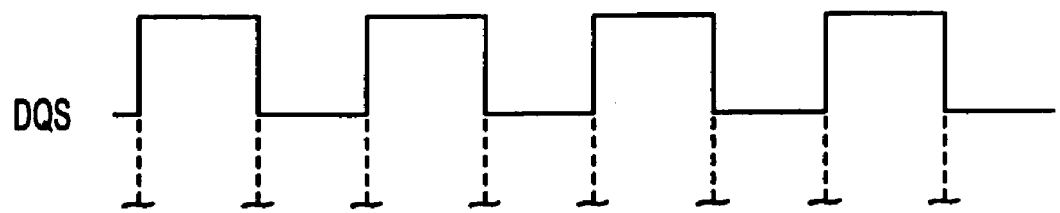
FIGS. 7(a)–7(c) depict DQS and data signals in accordance with an embodiment of the invention.
Figure 7B:
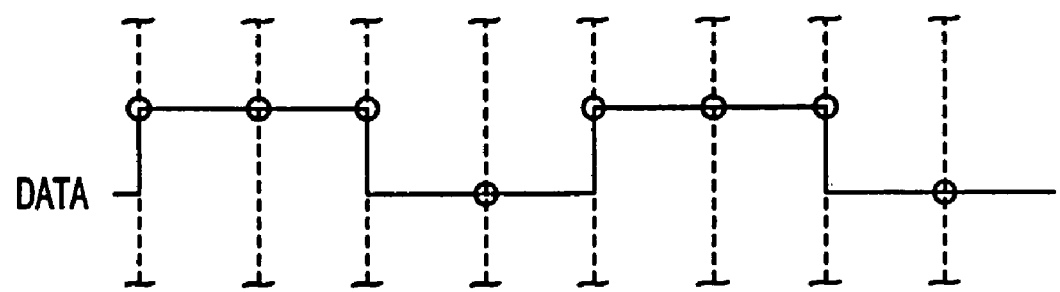
Figure 7C:
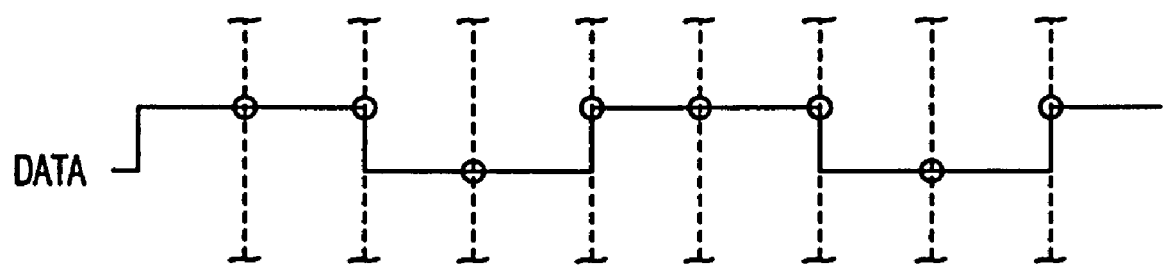

FIG. 6(d) represents a digital input signal inconsistent with the predetermined pattern ("1001"). Here, the clock transition edges fall on a right side of the data eye (i.e., the data is shifted left).

Due to the fact that a digital signal is indeterminate beyond the edges (both leading and trailing) of the data eye, FIGS. 6(c) and 6(d) represent the worst case scenarios for still being able to determine the value of the data. That is, if the data is shifted a little bit more to the right in FIG. 6(c), the data will be indeterminate. Similarly, if the data is shifted a little bit more to the left in FIG. 6(d), the data will be indeterminate.

Figure 8:
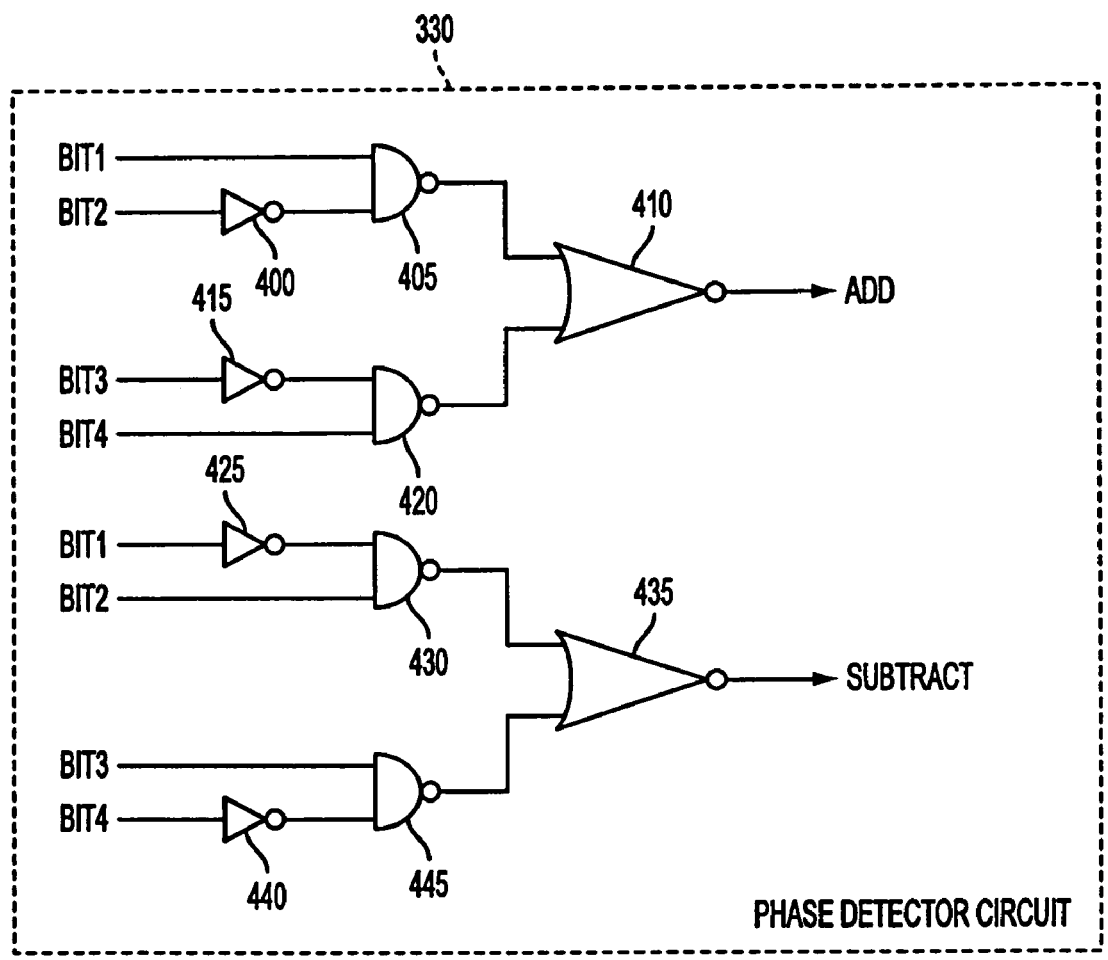
FIG. 8 depicts an exemplary schematic diagram of a phase detector of the FIG. 3 control system.
Figure 9:
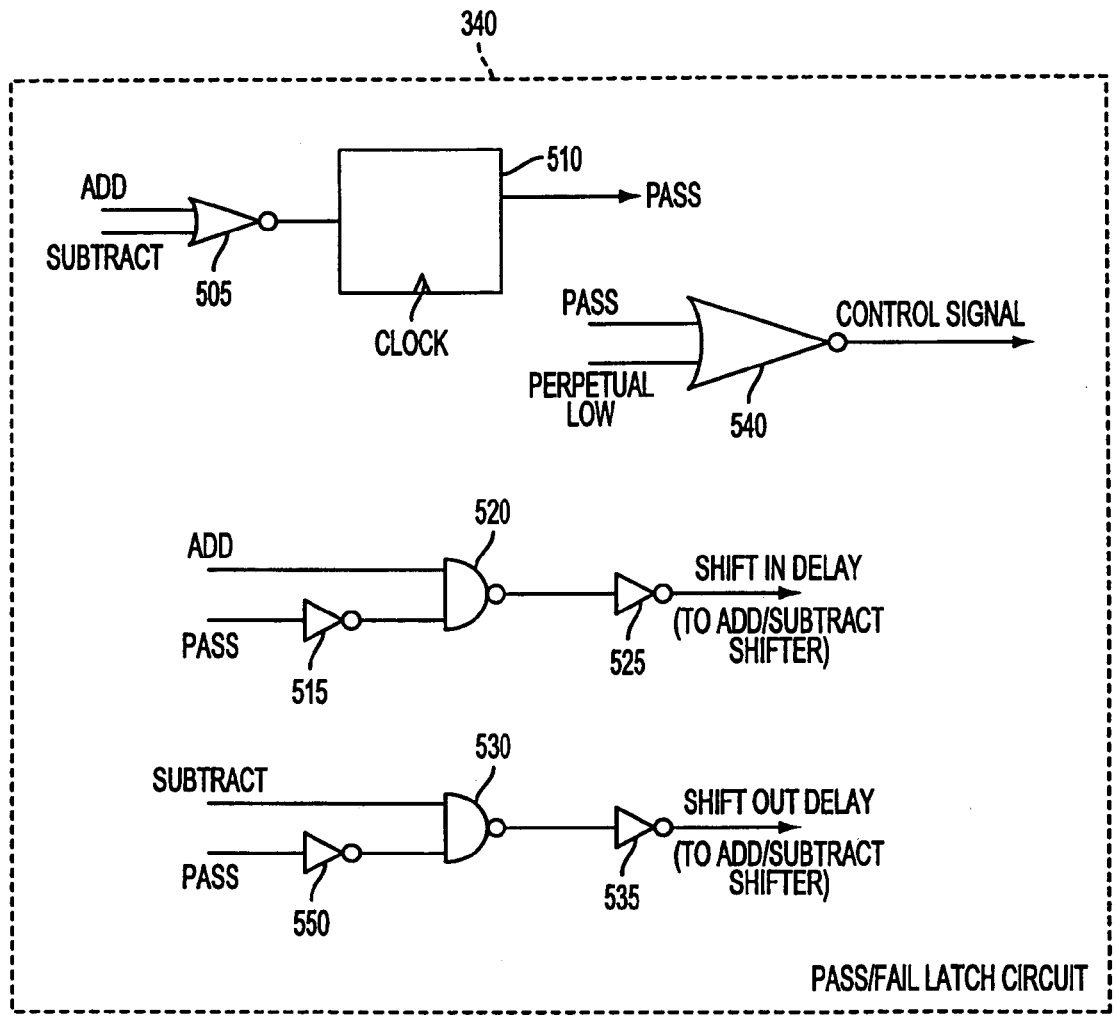
FIG. 9 depicts an exemplary schematic diagram of a pass/fail circuit of the FIG. 3 control system.

Due to the indeterminate status of the data at the extreme right and left sides of the digital signal, the calibration method of the invention is effective when the data is less than one-half of a clock cycle out of alignment with the clock. To guard against those conditions in which a clock transition edge is on a border of the data eye and may therefore be indeterminate (as in FIGS. 7(a)–(c)), the ADD and SUBTRACT outputs of the phase detector circuit 330 as described below in connection with FIGS. 4, 8 and 9 are treated as "states" of the circuit in accordance with an embodiment of the invention. For example, if SUBTRACT goes logic HIGH (i.e., the data is shifted right), then the circuit 330 will be in a SUBTRACT "state" and it will remain in such state (i.e., even if SUBTRACT goes logic LOW) until either ADD goes logic HIGH or until PASS goes logic HIGH.

Similarly, if ADD goes logic HIGH (i.e., the data is shifted left), then the circuit 330 will be in an ADD "state" and it will remain in such state (i.e., even if ADD goes logic LOW) until either SUBTRACT goes logic HIGH or until PASS goes logic HIGH.

Furthermore, to guard against starting out in a border case, when the LDMD register first enables the logic circuit 300, it also initializes the write data input path DQ into, e.g., an ADD state (i.e., ADD starts out logic HIGH), wherein the data is shifted slightly left as compared with the clock.

In accordance with the description of the "states" of the phase detector circuit 330, the circuit 330, shown in FIGS. 4, 8 and 9, determines what pattern the data register 320 has captured and outputs an "ADD" bit and a "SUBTRACT" bit over 2-bit bus 335 if a timing adjustment is needed. The 2-bit bus 335 is fed into pass/fail circuit 340. If neither an ADD or SUBTRACT bit are needed, e.g., a logic HIGH is produced, the pass/fail circuit 340 determines that the data is "passing" (i.e., the data being captured by the data register 320 is the same as the predetermined pattern, for example, "1100"). The output of pass/fail circuit 340 is fed into add/subtract shifter 350 over 2-bit bus 345.

In accordance with an embodiment of the invention, if the data is passing, add/subtract shifter 350 sends a control signal to the adjustable delay circuit 310 over line 360 instructing the circuit 310 to incrementally subtract a time delay to the data incoming over the data path DQ until the data fails (i.e., until the data register 320 captures a pattern that is different than the predetermined pattern, for example, "0110"). Once the data has failed, a starting edge of the data eye has been located. Once the control system 300 has located the starting edge of the data eye, the pass/fail circuit 340 sends a control signal to the adjustable delay circuit 310 instructing the circuit 310 to add a delay equal to one-half of the data eye (i.e., one-half of the 1.5 ns DIPW, or 0.75 ns), in accordance with an embodiment of the invention. Upon adding the delay of 0.75 ns, the control system 300 has calibrated the rate with which data enters the DRAM with the clock CLK such that the CLK's rising and falling edges are centered on the data eye as the data leaves the data latch 317. Thus, the DRAM can successfully capture the data. It should be noted that the control logic system 300 of FIGS. 3 and 4 may be very easily included on board a DRAM chip 380, as indicated in FIG. 4.

Operation of the phase detector 330 will now be described in connection with FIG. 8. Each of the four bits (bits 1–4) captured by the data register 320 (FIG. 4) are fed into phase detector circuit 330. Specifically, bit 1 is fed into an input of NAND gate 405 and bit 2 is fed into inverter 400 before being fed into NAND gate 405. The output of NAND gate 405 is fed into NOR gate 410. Bit 3 is fed into an inverter 415 before being fed into NAND gate 420. Bit 4 is fed directly into NAND gate 420. The output of NAND gate 420 is fed into NOR gate 410. When the output of NOR gate 410 goes to a predetermined logic level (e.g., HIGH), an ADD bit is fed into pass/fail latch 340.

Bit 1 is also fed into inverter 425 before being fed into NAND gate 430. Bit 2 is also fed directly into NAND gate 430. The output of NAND gate 430 is fed into NOR gate 435. Bit 3 is also fed into NAND gate 445. Bit 4 is also fed into inverter 440 before being fed into NAND gate 445. The output of NAND gate 445 is fed into NOR gate 435. When the output of NOR gate 435 goes to a predetermined logic level (e.g., HIGH), a SUBTRACT bit is fed into pass/fail circuit 340.

During operation, if bits 1–4 are respectively "1100," the required pattern, as captured by data latch 320 and fed into phase detector 330, then ADD is logic LOW and SUBTRACT is logic LOW and the data is passing (i.e., although the clock CLK edge may not be located at the center of the data eye, the clock edge is located on the data eye). However, if, for example, the data is shifted right (i.e., "0110"), then ADD will be logic LOW, while SUBTRACT will be logic HIGH. If the data is shifted left (i.e., "1001"), then ADD will be logic HIGH and SUBTRACT will be logic LOW. The significance of the logic states of ADD and SUBTRACT will be described more fully in connection with the pass/fail circuit 340 shown in FIG. 9.

Turning now to FIG. 9, an exemplary schematic diagram of pass/fail circuit 340 is depicted. The respective ADD and SUBTRACT outputs of NOR gates 410 and 435 (of FIG. 8) are fed into NOR gate 505. The output of NOR gate 505 is fed into latch 510. When both ADD and SUBTRACT are logic LOW, the data is passing and the output of latch 510, PASS, goes logic HIGH, otherwise, PASS is always logic LOW. It should be noted that the clock signal (clock) driving data latch 510 is not the DQS, but, rather, it is a clock having a frequency of approximately one-half that of the DQS because it needs two clock cycles to capture four bits of data.

The logic level of ADD is then fed into NAND gate 520. The logic level of PASS is fed into inverter 515 before being fed into NAND gate 520. The output of NAND gate 520 is fed into inverter 525. The output of inverter 525 is one bit of the 2-bit bus 345 connecting pass/fail circuit 340 with add/subtract shifter 350.

Still referring to FIG. 9, the logic level of SUBTRACT and PASS invert (via inverter 550) are fed into NAND gate 530. The output of NAND gate 530 is fed into inverter 535. The output of inverter 535 is the other bit of 2-bit bus 345.

During operation, when PASS is logic LOW (i.e., the data is failing) and ADD is logic HIGH, this signifies that the data being received at the data latch 320 is shifted left (e.g., "1001"), and the pass/fail circuit 340 is configured to output a logic HIGH on Shift-In delay, whereby the add/subtract shifter 350 will add an incremental delay to a subsequent data pattern. The subsequent data pattern is then compared with the predetermined pattern. If the data is still shifted left, add/subtract shifter 350 will again add an increment of delay to the next data pattern. The process is repeated until the data passes and the correct predetermined data string (e.g., "1100") is read at the data latch 320.

When PASS is logic LOW and SUBTRACT is logic HIGH, this signifies that the data being received at the data latch 320 is shifted right (e.g., "0110"), and the pass/fail circuit 340 is configured to output a logic HIGH on Shift- Out delay, whereby the add/subtract shifter 350 will subtract an incremental delay from a subsequent data pattern. The subsequent data pattern is then compared with the predetermined data pattern. If the data is still shifted right, add/subtract shifter 350 will again subtract an incremental delay from the next data pattern. The process is repeated until the data passes and the correct predetermined data string (e.g., "1100") is read at the data latch 320.

Whenever PASS is logic HIGH (i.e., the data is passing), whether upon start-up or after the data has first failed and has then been modified to pass, the pass/fail latch 340 is configured to output a logic HIGH on Shift-Out delay, whereby the add/subtract shifter 350 will subtract an incremental delay from a subsequent data pattern. The subsequent data pattern is then compared with the predetermined pattern. If the data is still passing, add/subtract shifter 350 will again subtract an incremental delay from a next data pattern. The process is repeated until the data fails. The purpose of incrementally subtracting delay from the data until the data fails is so that the leading edge of the data eye can be determined. At the same time, the output logic level of latch 510 (PASS) is fed into one input of NOR gate 540. The other input of NOR gate 540 is set to a perpetual logic LOW. When PASS is logic HIGH, the output of NOR gate 540 will always be logic LOW. Once the data fails, the leading edge of the data eye has been identified and a control signal is sent from pass/fail circuit 340 over communication link 365 to enable the adjustable delay circuit 310 to add a delay equal to one-half of the data eye. That is, when PASS goes logic LOW, the output of NOR gate 540, Control Signal, goes logic HIGH. Control Signal is sent to adjustable delay circuit 310 via communication link 365 to enable the delay circuit 310. In addition, when Control Signal goes logic HIGH, both the phase detector 330 and the pass/fail circuit 340 are disabled so as to discontinue the operation of the control logic system 300. Upon being enabled, the delay circuit is configured to automatically add a delay to the data equal to one-half the specified setup and hold time (e.g., 0.125 ns) such that the edge of each clock DQS cycle is located at the center of the data eye (as in FIG. 2).

It should be noted that while the control logic system 300 has been described as incrementally subtracting delay until the data fails, it could just as easily be configured to incrementally add delay until the data fails. At such time, as the data fails, a delay equal to approximately one-half of the data eye would be subtracted from the data, thereby placing the clock transition at the center of the data eye.

Figure 10:
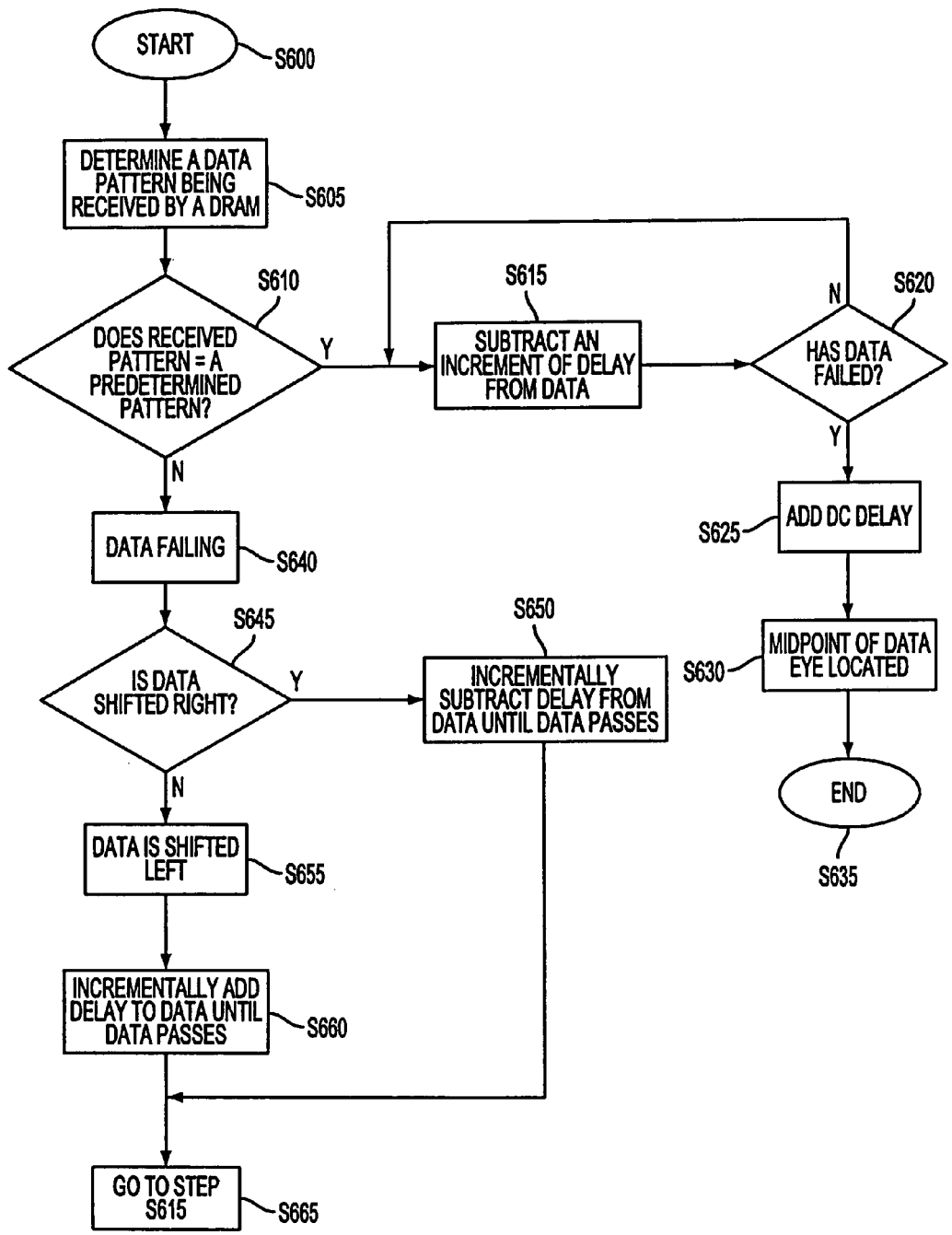
FIG. 10 depicts a flowchart illustrating an exemplary operational flow for the FIG. 3 control system, in accordance with an embodiment of the invention.

Turning to FIG. 10, a flowchart illustrating an exemplary operational flow for the control system of FIG. 4 is depicted. The flow starts at segment S600 and at segment S605, the system 300 determines the data pattern that is being received by the DRAM (i.e., at the data latch 320). At segment S610, the received pattern is compared with a predetermined pattern (e.g., "1100") by the phase detector 330 to determine if they are the same. If not, the data is determined to be failing at segment S640. At segment S645, a determination is made as to whether the failed data is shifted right (e.g., "0110"). If it is shifted right, at segment S650, the system 300 incrementally subtracts a delay from the data until the data passes (i.e., "1100"). Segment S665 then moves the operational flow to segment S615.

If, at segment S645, the data is not determined to be shifted right, the data is determined to be shifted left at segment S655. At segment S660, the system 330 incrementally adds a delay to the data until the data passes and segment S665 continues the operation at segment S615.

Whenever the data passes, as detected at segment 610, the data passes after a delay is incrementally added at segment S660 or incrementally subtracted at segment S650, segments S615–S635 are then performed as now described.

Once the data is determined to have passed, the system 300 subtracts an increment of delay from the data at segment S615. At segment S620, the system 300 determines whether the data has failed. If not, the system 300 returns to segment S615 to subtract another increment of delay from the data. However, if at segment S620 the data has failed, at segment S625, the system generates Control Signal and adds a delay. At segment S630, the midpoint of the data eye is located and the system ends at segment S635. As noted at segment S610, the received pattern is the same as a predetermined pattern, the system performs segments S615–S635 as described above.

Figure 11:
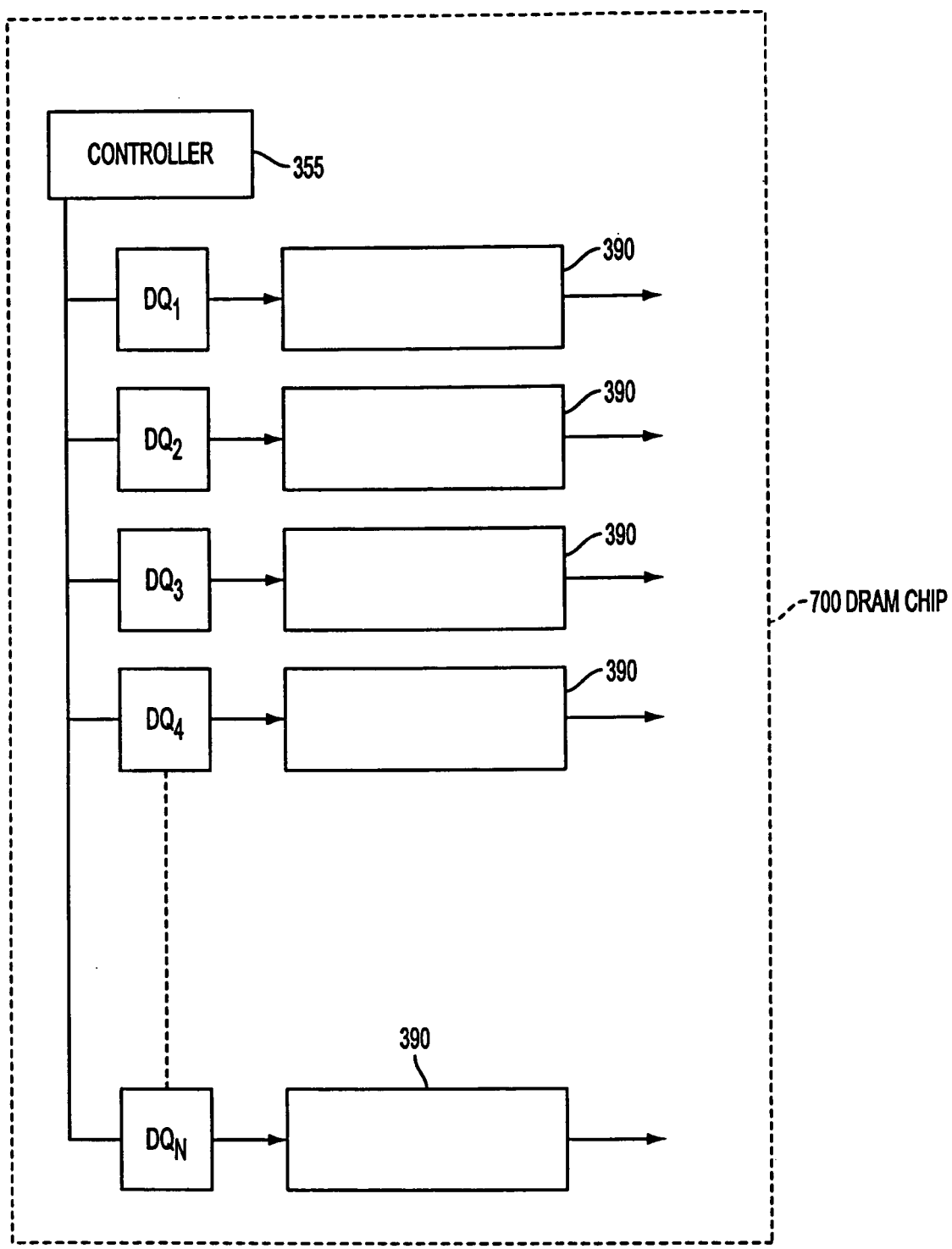
FIG. 11 depicts a plurality of DQ data paths being respectively coupled to a plurality of control systems, in accordance with an embodiment of the invention.

Turning to FIG. 11, a DRAM memory chip 700 is depicted as including a plurality of data paths ($DQ_I$–$DQ_N$) and a corresponding plurality of control systems 390 (of FIG. 3). In accordance with an embodiment of the invention, each of a plurality of data paths (DQs) may be independently calibrated with a corresponding control system 390. For example, a "bi-16" part having 16 DQ data paths is capable of independently calibrating each of the 16 DQs such that the edges of DQS are centered on the data eye of the data in the DQ, thus, enabling the DRAM to properly capture the data. It is also possible to multiplex control system 390 among each of the DQ data paths such that one DQ path is calibrated first and then control system 390 is switched to calibrate another path and so on.

Figure 12:
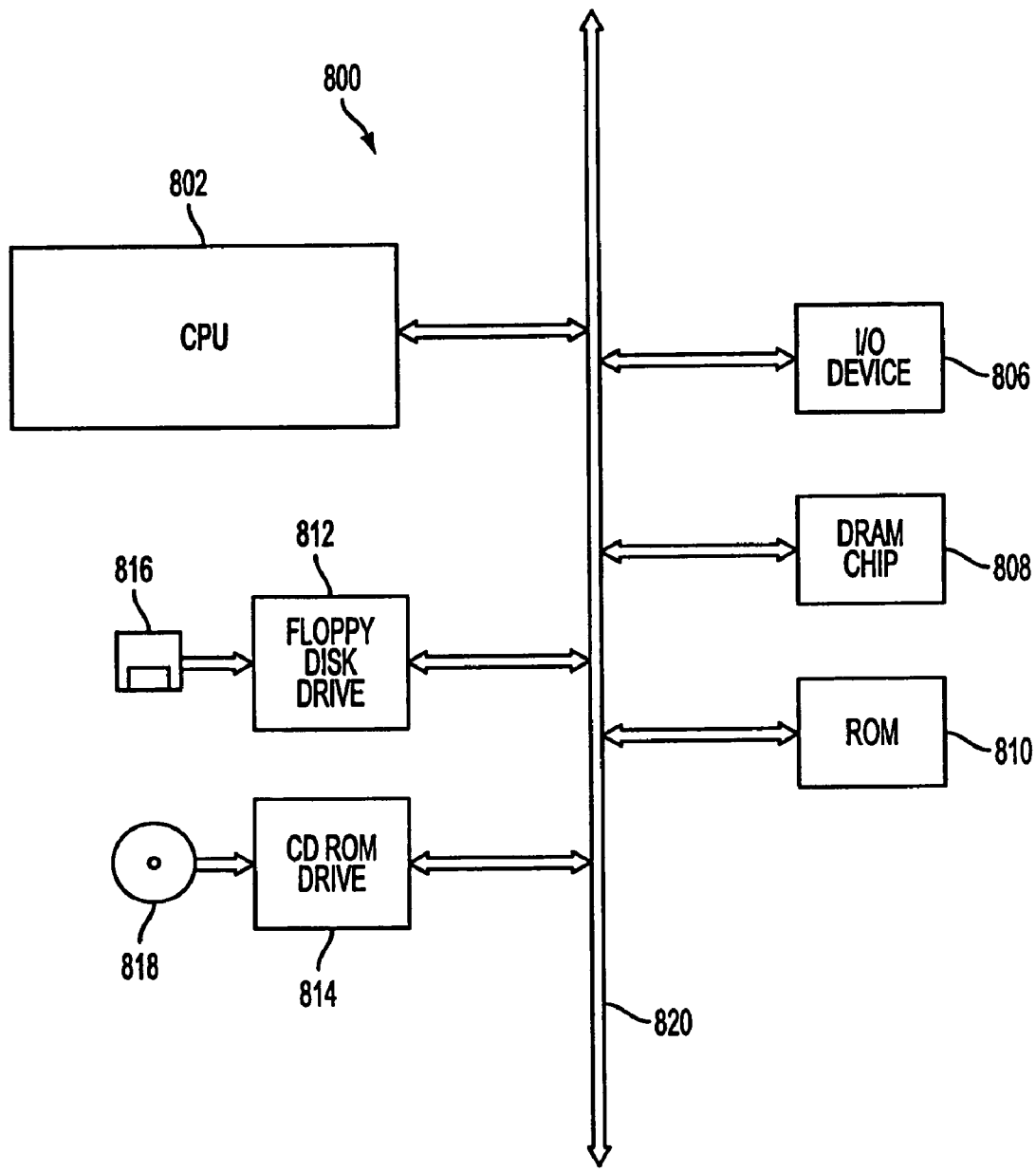
FIG. 12 depicts a processor-based system employing a DRAM containing the FIG. 3 control system, in accordance with an embodiment of the invention.

FIG. 12 illustrates a block diagram of a processor-based system 800 utilizing a DRAM chip 808 having one or more control systems 390 constructed in accordance with the present invention. That is, the DRAM chip 808 may be the DRAM chip 380 illustrated in FIG. 4 which operates as described above with respect to FIGS. 5–10. The processor-based system 800 may be a computer system or any other processor system requiring a DRAM chip. The system 800 includes a central processing unit (CPU) 802, e.g., a microprocessor, that communicates with the DRAM chip 808 over a bus 820. It must be noted that the bus 820 may be a series of buses and bridges commonly used in a processor-based system, but for convenience purposes only, the bus 820 has been illustrated as a single bus. An input/output (I/O) device 806 may also be connected to the bus 820, but is not necessary to practice the invention. The processor-based system 800 also includes a read-only memory (ROM) 810 and may include peripheral devices such as a floppy disk drive 812 and a compact disk (CD) ROM drive 814 that also communicates with the CPU 802 over the bus 820 as is well known in the art. It should also be noted that the control system 390 may be included in either one or both of the processor 802 or the memory 808 without deviating from the spirit or scope of the invention.

The present invention provides an improved control system for receiving data at an input port of a digital circuit, for example, a DRAM running under the DDR II standard. The system ensures that data is received by the DRAM upon the occurrence of a clock edge of the DRAM external DQS by positioning the clock edge at a midpoint of a data eye of the incoming data.

While preferred embodiments of the invention have been described and illustrated, it should be readily apparent that many modifications can be made to the invention without departing from its spirit or scope. For example, although specific components have been described for use within the control system depicted in FIGS. 8 and 9, any combination of similar or different components may be used without departing from the spirit or scope of the invention. In addition, although the invention has been described as a hardware implementation, it may also be implemented in software using the flowchart of FIG. 10. Moreover, although the invention is described for use with DRAMs, the invention may be used to calibrate inputs and outputs of any digital device. Furthermore, although the FIG. 10 flowchart describes an operation flow in which a leading edge of the data is identified followed by adding a delay to the data such that a midpoint of the data eye is located, it should be apparent that the invention may also be practiced by locating a trailing edge of the data followed by subtracting such a delay from the data until the midpoint of the data eye is located. Additionally, while the invention is described in connection with calibrating a write data input path to a corresponding clock, the method may be used to calibrate any digital path (e.g., command path, flag path, etc.) with any corresponding clock with which the digital path needs to be calibrated. Accordingly, the invention is not limited by the foregoing description or drawings, but is only limited by the scope of the appended claims.

What is claimed as new and desired to be protected by Letters Patent of the United States is:

1. A method of calibrating a data path of a digital circuit, the method comprising the acts of:
    positioning a clock transition of a clock signal at one edge of a data eye of a bit of data received on said data path; and
    relocating said clock transition to approximately a center of said data eye based on said one edge.

2. The method of claim 1, wherein said act of positioning comprises:
    adjusting relative timing of said bit of data with respect to said clock transition.

3. The method of claim 1, further comprising:
    clocking said bit of data on said data path into said digital circuit.

4. The method of claim 1, wherein said act of relocating comprises:
    adjusting relative timing of the bit of data with respect to said clock signal by a predetermined amount which is approximately equal to one-half of a width of said data eye.

5. The method of claim 4, wherein said act of adjusting comprises:
    delaying said bit of data by said predetermined amount.

6. The method of claim 4, wherein said act of adjusting comprises:
    advancing said bit of data by said predetermined amount.

7. A system for calibrating a data path of a digital circuit, the system comprising:
    a logic circuit for positioning a clock transition of a clock signal at one edge of a data eye of a bit of data received on said data path;
    said logic circuit also being configured to relocate said clock transition to approximately a center of said data eye based on said one edge.

8. The system of claim 7, wherein said logic circuit is configured to adjust relative timing of said bit of data with respect to said clock transition.

9. The system of claim 7, further comprising:
    a latch circuit for clocking said bit of data on said data path into said digital circuit using said clock signal.

10. The system of claim 7, wherein said logic circuit is configured to adjust relative timing of the bit of data with respect to said clock signal by a predetermined amount which is approximately equal to one-half of a width of said data eye.

11. The system of claim 10, wherein said logic circuit is configured to delay said bit of data by said predetermined amount.

12. The system of claim 10, wherein said logic circuit is configured to advance said bit of data by said predetermined amount.

13. An integrated circuit semiconductor device comprising a system for calibrating a data path of a digital circuit, the system comprising:
    a logic circuit for positioning a clock transition of a clock signal at one edge of a data eye of a bit of data received on said data path;
    said logic circuit also being configured to relocate said clock transition to approximately a center of said data eye based on said one edge.

14. The device of claim 13, wherein said logic circuit is configured to adjust relative timing of said bit of data with respect to said clock transition.

15. The device of claim 13, wherein said system further comprises:
    a latch circuit for clocking said bit of data on said data path into said digital circuit using said clock signal.

16. The device of claim 13, wherein said logic circuit is configured to adjust relative timing of the bit of data with respect to said clock signal by a predetermined amount which is approximately equal to one-half of a width of said data eye.

17. The device of claim 16, wherein said logic circuit is configured to delay said bit of data by said predetermined amount.

18. The device of claim 16, wherein said logic circuit is configured to advance said bit of data by said predetermined amount.

19. The device of claim 16, wherein said system further comprises:
    a receiver for receiving said bit of data;
    a storage device coupled to said receiver for temporarily storing a predetermined number of bits of said data; and
    an examining device coupled to said storage device for examining said predetermined number of bits of data for a predetermined bit pattern.

20. A processor system, comprising:
    a processor; and
    a dynamic random access memory (DRAM) coupled to said processor, at least one of said processor and memory having a system for calibrating a data path of a digital circuit, said system for calibrating comprising:
    a logic circuit for positioning a clock transition of a clock signal at one edge of a data eye of a bit of data received on said data path;
    said logic circuit also being configured to relocate said clock transition to approximately a center of said data eye based on said one edge.

21. The processor system of claim 20, wherein said logic circuit is configured to adjust relative timing of said bit of data with respect to said clock transition.

22. The processor system of claim 20, wherein said system for calibrating further comprises:
    a latch circuit for clocking said bit of data on said data path into said digital circuit using said clock signal.

23. The processor system of claim 20, wherein said logic circuit is configured to adjust relative timing of the bit of data with respect to said clock signal by a predetermined amount which is approximately equal to one-half of a width of said data eye.

24. The processor system of claim 23, wherein said logic circuit is configured to delay said bit of data by said predetermined amount.

25. The processor system of claim 23, wherein said logic circuit is configured to advance said bit of data by said predetermined amount.

26. The processor system of claim 23, wherein said system for calibrating further comprises:

a receiver for receiving said bit of data, a storage device coupled to said receiver for temporarily storing a predetermined number of bits of said data; and an examining device coupled to said storage device for examining said predetermined number of bits of data for a predetermined bit pattern.

\* \* \* \* \*